United States Patent
Heinrich et al.

(10) Patent No.: US 9,766,466 B2
(45) Date of Patent: Sep. 19, 2017

(54) SEMICONDUCTOR LASER MODULE

(71) Applicant: Pantec Engineering AG, Ruggell (LI)

(72) Inventors: Arne Heinrich, Feldkirch (AT);
Clemens Hagen, Mader (AT)

(73) Assignee: PANTEC ENGINEERING AG, Ruggell (LI)

( * ) Notice: Subject to any disclaimer, the term of this patent is extended or adjusted under 35 U.S.C. 154(b) by 0 days.

(21) Appl. No.: 14/894,015

(22) PCT Filed: Jun. 11, 2014

(86) PCT No.: PCT/EP2014/062128
§ 371 (c)(1),
(2) Date: Nov. 25, 2015

(87) PCT Pub. No.: WO2014/198773
PCT Pub. Date: Dec. 18, 2014

(65) Prior Publication Data
US 2016/0103328 A1    Apr. 14, 2016

(30) Foreign Application Priority Data

Jun. 12, 2013    (LU) .......................... 92214

(51) Int. Cl.
*G02B 3/00*    (2006.01)
*G02B 27/10*    (2006.01)
(Continued)

(52) U.S. Cl.
CPC ..... *G02B 27/0955* (2013.01); *G02B 19/0014* (2013.01); *G02B 19/0052* (2013.01);
(Continued)

(58) Field of Classification Search
CPC .. G02B 25/002; G02B 27/145; G02B 3/0056; G02B 3/0062; G02B 27/0961;
(Continued)

(56) References Cited

U.S. PATENT DOCUMENTS 5,321,718 A    6/1994  Waarts et al.
5,844,723 A   12/1998  Snyder
(Continued)

FOREIGN PATENT DOCUMENTS

DE    102005004478 A1    4/2006
EP         1376197         1/2001
WO         9534015        12/1995

OTHER PUBLICATIONS

Guther; "Stigmatic Focussing of Astigmatic Beams Emitted by Tapered Laser Diodes"; Jun. 10, 2006; XP055099658; Retrieved from the Internet: URL: http://www.dgao-proceedings.de/download/107/107_p5.pdf (retrieved on Nov. 19, 2015); 2 pages.
International Search Report for International Application No. PCT/EP2014/062128; International Filing Date Jun. 11, 2014; Date of Mailing Jul. 28, 2014; 4 pages.

*Primary Examiner* — Dawayne A Pinkney
(74) *Attorney, Agent, or Firm* — Cantor Colburn LLP

(57) ABSTRACT

A semiconductor laser module (10) comprises a tapered laser diode (12) and/or a tapered amplifier diode equipped with beam shaping optics (14). The tapered laser diode and/or the tapered amplifier diode includes an emission facet (16) for emitting a laser beam (18) along a beam axis (24). The beam-shaping optics comprise a plano-convex cylindrical lens oriented so as to change divergence of the beam in the fast axis direction, the plano-convex spherical cylindrical lens having a planar surface (26) arranged facing the facet and a circular cylindrical surface (22) facing away from the facet.

16 Claims, 4 Drawing Sheets

(51) Int. Cl.
*G02B 27/12* (2006.01)
*G02B 6/26* (2006.01)
*G02B 27/09* (2006.01)
*H01S 5/00* (2006.01)
*H01S 5/10* (2006.01)
*H01S 5/40* (2006.01)
*G02B 19/00* (2006.01)
*H01S 5/22* (2006.01)
*H01S 5/50* (2006.01)

(52) U.S. Cl.
CPC ..... *G02B 27/0966* (2013.01); *G02B 27/0994* (2013.01); *H01S 5/005* (2013.01); *H01S 5/1064* (2013.01); *H01S 5/22* (2013.01); *H01S 5/405* (2013.01); *H01S 5/50* (2013.01)

(58) Field of Classification Search
CPC ...... G02B 5/045; G02B 27/0955; F24J 2/145; B82Y 20/00; H01S 5/4031; H01S 5/005; H01S 5/1064; H01S 5/22; H01S 5/405

USPC ........ 359/809, 618–625, 627, 726–727, 839, 359/850, 853, 867, 638–641, 495; 372/34, 36, 43.01, 50.11, 50.12, 68–71, 372/75, 93, 99, 101, 107–109; 235/462.35; 385/27, 31, 33, 36, 39, 88
See application file for complete search history.

(56) References Cited

U.S. PATENT DOCUMENTS

| | | |
|---|---|---|
| 5,963,577 A | 10/1999 | Snyder et al. |
| 6,773,142 B2* | 8/2004 | Rekow ............... G02B 27/09 235/462.35 |
| 2003/0007257 A1 | 1/2003 | Bell, Jr. et al. |
| 2006/0176912 A1* | 8/2006 | Anikitchev ........ G02B 27/0966 372/9 |
| 2007/0116079 A1* | 5/2007 | Giniunas ............ G02B 27/0961 372/69 |
| 2014/0301421 A1* | 10/2014 | Kanskar ............... H01S 5/2036 372/46.01 |

* cited by examiner

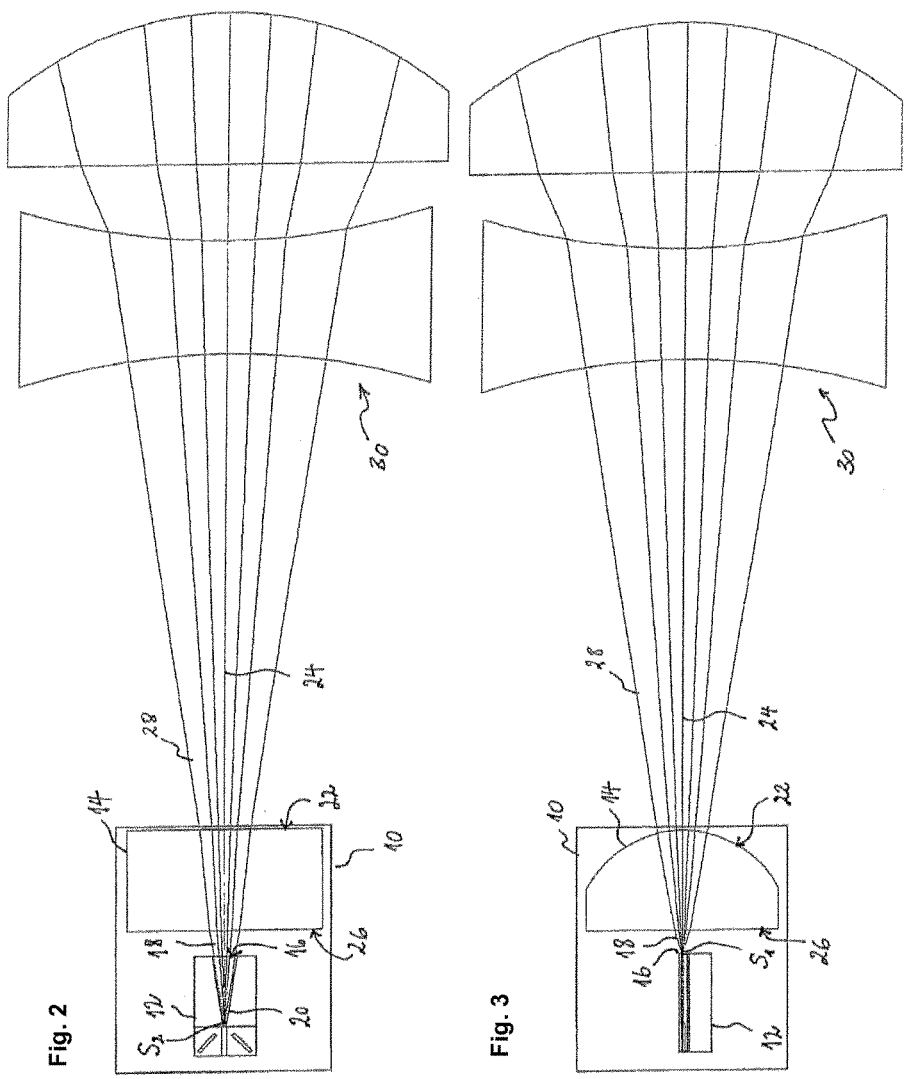

SEMICONDUCTOR LASER MODULE

CROSS REFERENCE TO RELATED APPLICATIONS

This is a U.S. National Stage of Application No. PCT/EP2014/062128, filed on 11 Jun. 2014. Priority under 35 U.S.C. §119(a) and 35 U.S.C. §365(b) is claimed from Luxembourg Application No. 92214 filed on 12 Jun. 2013, the entire disclosure of which is incorporated herein by reference.

TECHNICAL FIELD

The present invention generally relates to a semiconductor laser module, in particular, a semiconductor laser module comprising a tapered laser diode or a tapered amplifier diode in combination with beam shaping optics arranged in front of the output facet of the tapered laser diode or the tapered amplifier diode.

BACKGROUND OF THE INVENTION

Semiconductor lasers (or in short laser diodes) have become part of our daily life. They are robust, price competitive and capable of converting electric power into light with up to 70% efficiency. Some of the most well-known consumer applications are DVD players and laser pointers, where the requirements regarding output power are not so demanding. For professional applications, the power level needed is significantly higher, and requires the implementation of dedicated high power 15 designs. However, increasing the power generally comes at a cost in terms of beam quality.

Historically, laser diodes were used to pump solid state lasers and employed in material processing, like heat-treating of metal for hardening, which required no particularly good beam quality and consequently no high brightness. Nevertheless high-power laser diodes, in particular single emitters and bars are developing fast. The achievable power per device is rising, the efficiency is increasing, and the facet damage threshold is continuously improving. Nevertheless, their poor beam quality has prevented laser diodes from being successfully used for welding, cutting and marking, applications, which are dominated by lamp and diode pumped solid-state lasers that exhibit about an order of magnitude higher brightness than semiconductor lasers. Over the last years, new semiconductor laser diode designs, capable of making high-power diode beams brighter, have been developed. Not surprisingly, therefore, direct diode systems are becoming more and more competitive in applications requiring good beam quality and high power. The industrial interest is related to the potential enormous increase in efficiency from current 2 to 30% for optically pumped laser systems to expected over 40 to 60% for direct diode laser systems. High efficiency speaks for simplified cooling systems, less electrical power consumption and reduced operating costs. Additionally, laser diode systems show excellent reliability, providing multiple years of maintenance-free operation. The current trend suggests that diode lasers will replace optically pumped lasers in the near future, first in the low power and later also in the higher power classes. Beside the replacement of existing technology, high brightness laser diodes open up new applications like in laser projection and display systems for large screen, as well as in home entertainment systems. The advances in laser-diode technology that have enabled direct diode applications have been driven by increases in the power-per-laser-diode emitter, reductions in the beam divergence and improvements that have been made to collimating and beam-combining optics. However, the edge-emitting laser diode facet technology has, by far, had the greatest impact on the overall approach. Now, developers are pushing to improve beam quality in order to be able to put the high efficiency of diodes to work in high-power applications, such as, e.g. cutting and welding of metal sheets.

Within the numerous new laser designs aiming at the improvement of laser brightness, tapered laser diode technology is especially promising. Tapered laser diodes or tapered amplifier diodes can provide exceptionally bright, high-quality output with powers up to 10 W. The close to single mode beam quality enables highly effective fiber coupling into small fibers and brings within reach even direct nonlinear harmonic generation. Moreover, by employing newly developed beam combining schemes, the power could be scaled up while preserving a good beam profile. The high brilliance and power make real industrial deep-penetration welding possible with a direct-diode laser, achieving results comparable to optically pumped solid-state lasers.

TECHNICAL PROBLEM

It is an object of the present invention to provide a semiconductor laser module, which enables the combination of high power capability and a good beam profile. This object is achieved by a semiconductor laser module as claimed in claim 1.

GENERAL DESCRIPTION OF THE INVENTION

According to the invention, a semiconductor laser module comprises a tapered laser diode and/or a tapered amplifier diode equipped with beam shaping optics. The tapered laser diode and/or the tapered amplifier diode includes an emission facet for emitting a laser beam along a beam axis. The beam-shaping optics comprise a plano-convex cylindrical lens oriented so as to change divergence of the beam in the fast axis direction, the plano-convex spherical cylindrical lens having a planar surface arranged facing (i.e. turned toward) the facet and a circular cylindrical surface facing away (turned away) from the facet.

In the context of the present document, the term "semiconductor laser module" designates a unit that contains one or more laser or amplifier diodes, in combination with beam shaping optics, such as, in particular, divergence-adjusting optics. Optionally, a semiconductor laser module may include electronics (such as e.g. one or more diode drivers, a power stabilization circuit, etc.), a cooling arrangement, nonlinear optical elements, etc. The term "fast axis direction" designates the direction perpendicular to the beam axis in which the divergence of the beam after the facet, but before divergence correction, is greatest. The fast axis direction corresponds to the direction of the small extension of the facet. Conversely, the term "slow axis direction" designates the direction perpendicular to the beam axis in which the divergence of the beam after the facet, but before divergence correction, is least. The slow axis direction corresponds to the direction of the large extension of the facet. A tapered laser diode or a tapered amplifier diode comprises a gain region with a (full) taper angle preferably comprised in the range from 2° to 9°.

The present invention uses a tapered laser diode or a tapered amplifier diode in combination with a plano-convex spherical cylindrical lens (rather than with an aspheric cylindrical lens), arranged (preferably directly) in front of the diode facet. The plano-convex spherical cylindrical lens reduces divergence of the laser beam in fast axis direction. The radius of curvature of the circular cylindrical surface of the plano-convex cylindrical lens is preferably chosen such that the divergence of the beam in fast axis direction is reduced to match the divergence of the beam in slow axis direction, or, in case of different beam quality factors in the slow and fast axis directions, the divergence of the beam in slow axis direction multiplied with the ratio of the beam quality factor in fast axis direction to the beam quality factor in fast axis direction.

As those skilled in the art will appreciate, tapered laser or amplifier diodes combine the high beam-quality of a ridged waveguide design with the output powers previously only available from broad-area diode lasers. Preferably, the tapered laser or amplifier diode comprises a laterally tapered gain section (in combination with a ridge-waveguide section in case of a tapered laser diode), which can be fabricated reproducibly at competitive costs. Tapered diode lasers may produce diffraction-limited output powers up to several Watts in continuous wave operation, which is several times brighter than .what, for instance, gain guided wide-stripe laser diodes have been shown to output.

Preferably, the plano-convex cylindrical lens is configured and positioned such that its circular cylindrical surface intersects the beam axis at an axial position where the ratio $d_s/d_f$ of the slow axis beam diameter $d_s$, to the fast axis beam diameter $d_f$ of the laser beam (after passage through the lens) amounts to a value in the range from $0.87 \cdot M_s^2/M_f^2$ to $1.15 \cdot M_s^2/M_f^2$, where $M_f^2$ and $M_s^2$ denote the beam quality factor in fast axis direction and slow axis direction, respectively.

For the purposes of the present document, a beam diameter at an axial location in a certain transversal direction is defined as the distance between the points on an axis perpendicular to the beam axis and extending in the direction of interest at which the optical intensity drops to $1/e^2$ of the optical intensity on the beam axis. A (full) beam divergence angle $\theta$ is defined as:

$$\theta = \lim_{z-z0 \to \infty} \frac{d}{z - z0} \quad \text{(Eq. 1)}$$

where d is the $1/e^2$ diameter in the (transversal) direction of interest, z0 is the location of the beam waist with respect to that direction and z is a coordinate on the beam axis. It follows that the (full) fast axis divergence angle $\theta_f$ may be expressed as:

$$\theta_f = \lim_{z-z0 \to \infty} \frac{d_f}{z - z0f} \quad \text{(Eq. 2)}$$

where z0f denotes the location of the beam waist in the fast axis direction. Analogously, the (full) slow axis divergence angle $\theta_s$ may be expressed as $$\theta_s = \lim_{z-z0 \to \infty} \frac{d_s}{z - z0s} \quad \text{(Eq. 3)}$$

where z0s denotes the location of the beam waist in the slow axis direction. It is worthwhile noting that z0f≠z0s for an astigmatic beam.

As used herein, the beam quality factors $M_f^2$ and $M_s^2$ are defined as the ratio of the beam parameter product relative to the fast, respectively to the slow, axis direction to the beam parameter product of a diffraction-limited, perfect Gaussian beam of the same wavelength (denoted λ):

$$M_f^2 = \frac{\pi}{\lambda} \frac{d_{f0}\theta_f}{4} \quad \text{(Eq. 4)}$$

and $$M_s^2 = \frac{\pi}{\lambda} \frac{d_{s0}\theta_s}{4} \quad \text{(Eq. 5)}$$

where $d_{f0}$ and $d_{s0}$ denote the beam diameters at the beam waists in fast and slow axis direction, respectively.

As those skilled will appreciate, by adjusting the beam divergence in fast axis direction to the beam divergence in slow axis direction using the plano-convex 15 cylindrical lens positioned such that $0.87 \cdot M_s^2/M_f^2 \leq d_s/d_f \leq 1.15 \cdot M_s^2/M_f^2$ at the axial position where the circular cylindrical surface intersects the beam axis, an elliptical power density distribution is achieved, which can be focused into a circular focus using comparatively uncomplicated optics, if the plano-convex cylindrical lens adjusts the fast axis beam divergence $\theta_f$ such that it matches the product of the slow axis beam divergence $\theta_s$ and the ratio $M_s^2/M_f^2$, i.e. if after the lens: $\theta_f = \theta_s \cdot M_s^2/M_f^2$. In this case, the focusing optics can have the same focusing power in both directions, meaning that circular symmetric optics would be suitable. However, if the beam is elliptical, the focusing optics need not have the full circular dimension. It follows from these considerations that the laser beam can be coupled into an optical fiber with good coupling efficiency.

Preferably, the planar surface of the plano-convex cylindrical lens is arranged at a distance from the facet comprised in the range from 50 μm to 1 mm, more preferably in the range from 50 μm to 500 μm, and most preferably in the range from 50 μm to 250 μm.

According to preferred embodiments of the invention, the laser beam emitted at the facet has an uncorrected fast axis divergence half-angle ($\theta_f/2$) comprised in the range from 12-23° and an uncorrected slow axis divergence half-angle ($\theta_s/2$) comprised in the range from 6-13°.

Preferably, the plano-convex cylindrical lens has a refractive index, denoted n, that satisfies the condition $$93\% \cdot \sqrt{\sin u_f / \sin\left(u_s \cdot \frac{M_f^2}{M_s^2}\right)} \leq \quad \text{(Eq. 6)}$$

$$n \leq 107\% \cdot \sqrt{\sin u_f / \sin\left(u_s \cdot \frac{M_f^2}{M_s^2}\right)},$$

where $u_f$ denotes the uncorrected fast axis divergence half-angle of the laser beam (i.e. the fast axis divergence half-angle that the laser beam would have if the planoconvex spherical cylindrical lens were absent; $u_f = \theta_f/2$) and $u_s$ denotes the (uncorrected) slow axis divergence half-angle of the laser beam (i.e. $u_s = \theta_s/2$).

The radius of curvature (denoted r) of the circular cylindrical surface of the plano-convex cylindrical lens is preferably chosen such that it satisfies the condition:

$$87\% \cdot \frac{d_f}{2(n+1)\tan\left(u_s \cdot \frac{M_f^2}{M_s^2}\right)} \leq r \leq 115\% \cdot \frac{d_f}{2(n+1)\tan\left(u_s \cdot \frac{M_f^2}{M_s^2}\right)} \quad \text{(Eq. 7)}$$

where $d_f$ denotes the beam diameter in the fast axis direction of the laser beam at the axial position in which the circular cylindrical surface intersects the beam axis (at this position, one preferably has: $d_f = d_s \cdot M_s^2/M_f^2$, n denotes the refractive index and $u_s$ denotes the (uncorrected) slow axis divergence half-angle of the laser beam.

The facet of the tapered laser or amplifier diode preferably has a width in slow axis direction comprised in the range from 150 µm to 2 mm and a height in fast axis direction comprised in the range from 0.1 µm to 5 µm.

The plano-convex cylindrical lens preferably has a focal length comprised in the range from 1 mm to 10 mm. Such focal length is typically suitable for adjusting the fast axis divergence to the slow axis divergence but not for, strictly speaking, collimating the laser beam. Indeed, such focal length exceeds the focal lengths of typical fast axis collimators (FACs), whose focal lengths are usually less than 1 mm.

A preferred embodiment of the invention relates to a semiconductor laser array comprising a stack of a plurality of semiconductor laser modules as described herein. The semiconductor laser modules of such an array are preferably substantially identical.

BRIEF DESCRIPTION OF THE DRAWINGS

Preferred embodiments of the invention will now be described, by way of example, with reference to the accompanying drawings, in which:

FIG. 2: is a top schematic view of the semiconductor laser module of FIG. 1 with additional beam collimating optics;

FIG. 3: is a lateral schematic view of the system of FIG. 2;

DESCRIPTION OF PREFERRED EMBODIMENTS

Figure 1:
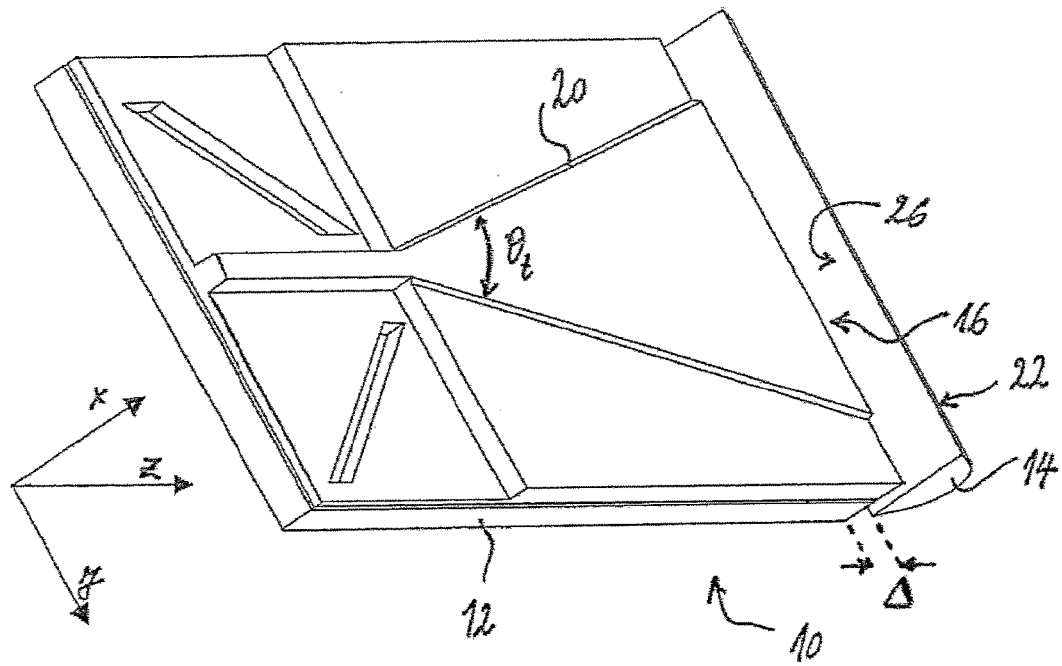
FIG. 1: is a perspective schematic view of a semiconductor laser module according to a first preferred embodiment of the invention.

FIG. 1 illustrates a semiconductor laser module 10 according to a first preferred embodiment of the invention. Semiconductor laser module 10 comprises a tapered laser diode 12 and beam shaping optics in the form of a plano-convex spherical cylindrical lens 14. Lens 14 is arranged directly in front of the output facet 16 of the tapered laser diode 12.

The beam output by the tapered laser diode 12 is highly astigmatic and elliptical. The reason for this is that the laser diode facet has an elliptical cross section and has different divergences for the fast axis (fast axis divergence angle $\theta_f$ between 24 and 46°) and the slow axis (the slow axis divergence angle $\theta_s$, depends on the taper angle $\theta_t$). With a taper angle of 6° the slow axis divergence angle $\theta_s$ of the output beam amounts to about 20° due to diffraction at the facet 16. In the context of the example discussed with respect to FIGS. 1 to 3, the $M^2$ factors are assumed to be approximately 1 both for the slow axis direction and the fast axis direction.

Tapered laser diodes are index-guided devices and typically have an active layer with a cross section size at the facet of about 0.1 µm by 150 µm. The $1/e^2$ diameters of the emission stripe are typically 1 µm and 190 µm directly at the facet, due to beam spreading into the surrounding lower index material, which leads to an ellipticity (ratio of minimum to maximum beam diameter) of less than 0.01. Different design parameters may result in ellipticity in the range from 0.002 to 0.03.

As best shown in FIGS. 2 and 3, the beam 18 is strongly astigmatic, since, in the direction perpendicular to the quantum well, it appears to diverge from a virtual source $S_1$ in close proximity of the output facet 16, but, in the plane of the quantum well, it appears to diverge from a virtual source $S_2$ that is located deeply inside the gain region 20. The magnitude of the astigmatism is the linear distance between $S_1$ and $S_2$. Whereas for index-guided, low power laser diodes the astigmatism amounts typically to 5 µm-15 µm and for gain-guided diodes the astigmatism may be as large as 50 µm, for tapered laser diodes the astigmatism may be larger than 500 µm or even more than 1000 µm in case of high power devices.

To correct the astigmatism, the plano-convex spherical cylindrical lens 14 is arranged such that the laser beam is circular (i.e. has an ellipticity of less than 0.87) at the axial position where the circular cylindrical surface 22 of the lens 14 intersects the beam axis 24 and configured such that the fast axis divergence of the laser beam 28 behind the lens 14 is reduced to match the divergence of the slow axis divergence of the laser beam 28 behind the lens.

Figure 4:
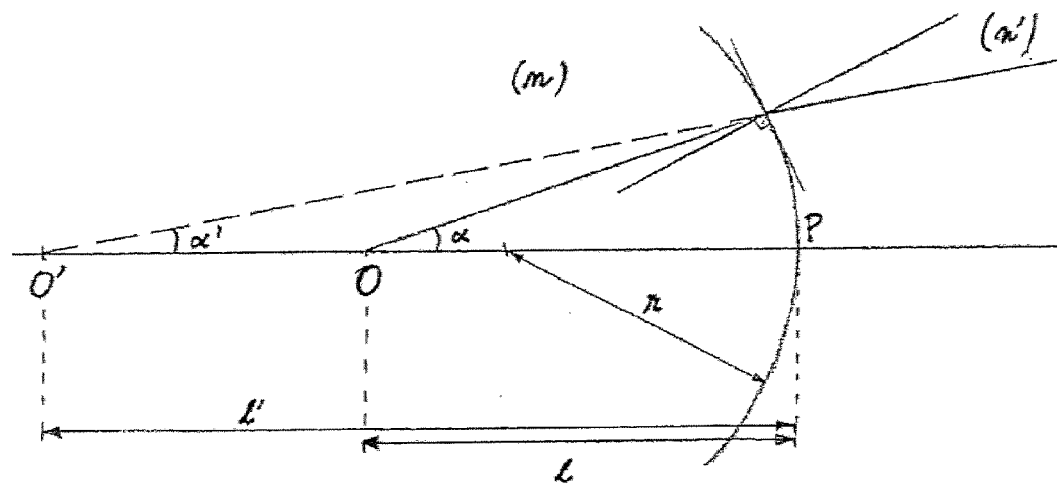
FIG. 4: is an illustration of the aplanatic condition.

There is a special condition, called aplanatic condition, in which a spherical surface (or, if only one transversal direction is considered, a circular cylindrical surface) introduces no spherical aberration. In the aplanatic condition not just all orders of spherical aberration, but also primary coma is zero for finite angles, which makes the lens more tolerant to misalignment. A spherical lens configured so as to satisfy the aplanatic condition may thus be considered more powerful than an aspheric lens, since the latter introduces primary coma. The aplanatic condition is mainly used to image a point source like in a microscope objective, but also works for line sources, which is a good approximation for the laser diode facet. FIG. 4 illustrates the aplanatic condition for a light ray originating from a source O in an optically thick medium with refractive index n and passing to an optically thinner medium with refractive index n', i.e. n>n'. The inclination angle α between the optical axis and the light ray is reduced at the boundary surface between the two media, which is spherical (or circular cylindrical, as in the invention). For an observer behind the spherical surface, all the light rays originating from O thus appear to originate from the virtual image O'. When the aplanatic condition is not met, the position of the virtual image O' depends on the inclination angle α, i.e. there is spherical aberration. No spherical aberration occurs when the aplanatic condition is met. This means, mathematically, that:

$$\frac{\sin\alpha'}{n'} = \frac{\sin\alpha}{n} \quad \text{(Eq. 8)}$$

Furthermore, the distances l between the source O and the point of intersection P of the spherical (circular cylindrical) surface and the optical axis and l' between the virtual image O' and P have to satisfy the following relationships:

$$l = \frac{n+n'}{n} \cdot r \quad \text{(Eq. 9)}$$

and $$l' = \frac{n+n'}{n'} \cdot r, \quad \text{(Eq. 10)}$$

where r denotes the radius of the curved surface.

A comprehensive deduction of the aplanatic condition can be found in P. Drude, "Lehrbuch der Optik, $3^{rd}$ edition, ISBN: 3864547873 (Trapeza). When the optically thinner medium is air, n'=1, and the relationships simplify to:

$$\sin\alpha' = \frac{\sin\alpha}{n}, \quad \text{(Eq. 11)}$$

$$l = \frac{n+1}{n} \cdot r \quad \text{(Eq. 12)}$$

and $$l' = \frac{n+1}{n'} \cdot r. \quad \text{(Eq. 13)}$$

According to the illustrated embodiment of the invention, the plano-convex spherical cylindrical lens 14 is configured and arranged to satisfy the aplanatic condition in such a way that the virtual source S2 of the slow axis divergence substantially coincides with the virtual image of the virtual source S1 of the fast axis divergence.

Figure 5:
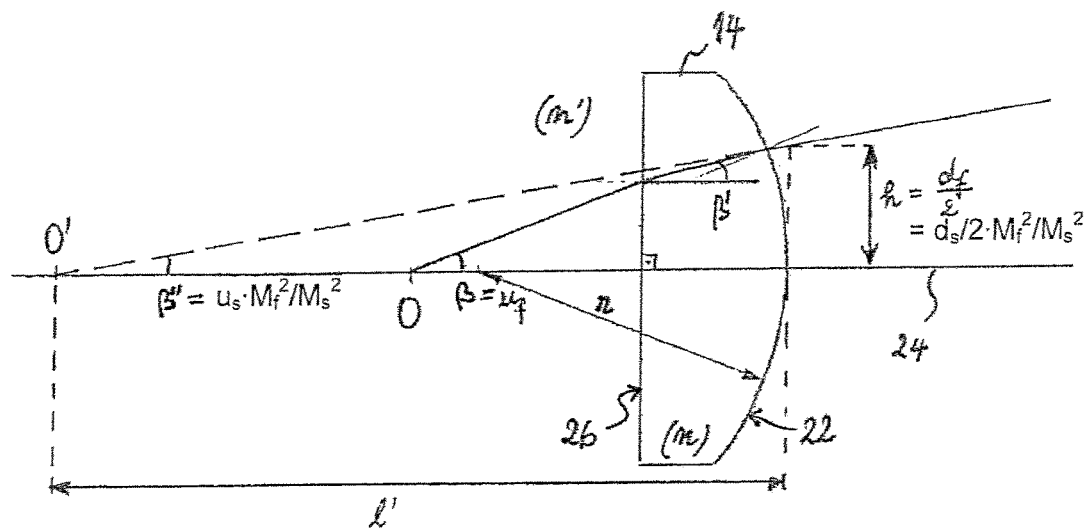
FIG. 5: is an illustration of beam refraction by a thick lens.

In the theoretical situation of FIG. 4, there is only one boundary surface. In practice, however, the laser beam 18 enters the optically denser medium at the planar surface 26 of the lens 14 and leaves it across the circular cylindrical surface 22. As illustrated in FIG. 5, a light ray with inclination angle β is refracted at the first boundary surface such that:

$$\sin\beta' = \frac{n'}{n}\sin\beta \text{(Snell's law)}, \quad \text{(Eq. 14)}$$

where β' is the inclination angle of the beam inside the lens. If the aplanatic condition is satisfied, it follows for the refraction at the second, curved, boundary surface:

$$\sin\beta'' = \frac{n'}{n}\sin\beta' = \left(\frac{n'}{n}\right)^2 \sin\beta \quad \text{(Eq. 15)}$$

where β" is the inclination angle of the beam after passage through the lens 14. What follows from this relation (with n' being the refractive index of air, i.e, n'=1) is that for given fast and slow axis divergences (which depend on the laser diode configuration), the refractive index n of the lens 14 is chosen such that the equation $$n = \sqrt{\sin u_f / \sin\left(u_s \cdot \frac{M_f^2}{M_s^2}\right)} = \sqrt{\sin u_f / \sin u_s} \quad \text{(Eq. 16)}$$

where $u_f$ denotes the uncorrected fast axis divergence half-angle (i.e, the fast axis divergence half-angle before the lens 14) and $u_s$ denotes the uncorrected slow axis divergence half-angle (i.e. the slow axis divergence half-angle before the lens 14), is satisfied. In practice, this means that the material of the lens 14 is chosen such that 25 its refraction index satisfies $$93\% \cdot \sqrt{\sin u_f / \sin u_s} \leq n \leq 107\% \cdot \sqrt{\sin u_f / \sin u_s}. \quad \text{(Eq. 6')}$$

Those skilled will note that some spherical aberration results from the presence of the first, planar, surface 26 of the lens 14. In order to keep these spherical aberrations small, the planar surface 26 is positioned as close to the facet 16 as possible. In practice, this means that the distance Δ between the planar surface 26 and the facet 16 should not exceed 1 mm. In the illustrated embodiment, Δ is comprised in the range from 50 μm to 500 μm. The thickness of the lens 14 is then selected such that $d_f/d_s = M_f^2/M_s^2$, i.e. (in this example) such that the beam is circular, at the axial position where the circular cylindrical surface 22 of the lens 14 intersects with the beam axis 24. During the design of the beam shaping optics, this lo step is preferably carried out using a ray-tracing program or a lens design program on a computer.

Finally, the radius of curvature r of the lens is chosen such that, after passage of the laser beam through the lens, the fast axis divergence is substantially in agreement with the slow axis divergence (since in this example $M_f^2 \approx 1$ and $M_s^2 \approx 1$). With reference to FIG. 5, let h denote the $1/e^2$ radius of the beam at the axial position where the circular cylindrical surface 22 of the lens 14 intersects with the beam axis 24. Assuming that the lens 14 reduces the fast axis divergence to the slow axis divergence, it follows from l'=(n+1)·r that $$r = \frac{l'}{n+1} = \frac{h}{(n+1)\tan u_s} = \frac{d_f}{2(n+1)\tan u_s}, \quad \text{(Eq. 17)}$$

where $d_f$ designates here the $1/e^2$ diameter of the beam at the axial position of the intersection of the curved lens surface with the beam axis 24. With some tolerance, one finally obtains:

$$87\% \cdot \frac{d_f}{2(n+1)\tan u_s} \leq r \leq 115\% \cdot \frac{d_f}{2(n+1)\tan u_s}. \quad \text{(Eq. 7')}$$

With the above parameters of the plano-convex spherical cylindrical lens 14, the beam 28 obtained after the lens 14 has substantially circular power density distribution and substantially equal beam divergence angles in fast and slow axis directions. With the above assumption $M_f^g \approx 1$ and $M_s^2 \approx 1$, it is, therefore, comparatively easy to couple the obtained beam into an optical fiber with a good coupling efficiency. Indeed, the laser beam can be collimated using an aspheric lens or a lens group 30, as shown in FIGS. 2 and 3.

It shall be noted that the way of matching the fast and slow axis divergence angles may not be possible with every type of laser diode or amplifier diode, since a certain amount of astigmatism is required for a given pair of divergence angles. It is the inventors' merit to have recognized that the correction mechanism presented herein can be used for tapered laser diodes and tapered amplifier diodes, due to the comparably high value of the astigmatism.

As will be appreciated, the proposed scheme is a compact and powerful way to remove astigmatism and to circularize the beam of a tapered laser diode, which is highly astigmatic and elliptic. Only a single plano-convex spherical cylindrical lens with a specific refractive index is necessary for this purpose. An aspheric lens may thereafter be used to collimate the beam and/or to couple the beam into an optical fiber. The far field beam profile, or the focused spot, can be free of the side lobes and be nearly diffraction-limited. Due to the low number of lenses and the absence of truncating elements, the total power loss of the optical system may be reduced to less than 20%, which is much less than in systems using anamorphic prisms, a single mode fiber or a small aperture for circularizing a beam output by a laser or amplifier diode.

A very interesting advantage of using a plano-convex spherical cylindrical lens is that such lenses are easy to manufacture with high precision and also, compared with aspheric lenses, inexpensive. Since, in the illustrated configuration, spherical aberration is substantially eliminated, the use of a spherical cylindrical lens instead of an aspheric lens does not negatively affect beam quality. To the contrary, with primary coma being also eliminated, slight misalignment does not translate into a significantly deteriorated beam quality as in the case of an aspheric lens.

Example 1

A semiconductor laser module as shown in FIGS. 1 to 3 has been implemented with a tapered laser diode (wavelength λ=980 nm). The taper angle of the gain region was 6° (full angle). The facet measured 425 µm (slow axis direction) to 3 µm (fast axis direction). Without correction, fast axis divergence was 42° (full angle) and slow axis divergence 20° (full angle) at an output power of 8.5 W. $M_f^2=M_s^2=1$. For matching the fast axis divergence to the slow axis divergence, a fused silica plano-convex spherical cylindrical lens (n=1.45) with r=1.0 mm and a thickness of 1.42 mm (on the beam axis) was placed at a distance Δ=150 µm from the facet of the tapered laser diode. The conditions on n (Eq. 6) and r (Eq. 7) were thus met. Ellipticity of the laser beam on the curved surface of the lens amounted to 0.97 (i.e. the beam was circular). The fast axis divergence after the lens was reduced to 20.1° (full angle), which is approximately equal to the slow axis divergence.

Example 2

The identical laser diode of example 1 was chosen with the difference that the $M_f^2=1$ and $M_s^2=2$. For matching the fast axis divergence to $M_f^2/M_s^2$ times the slow axis divergence, a plano-convex spherical cylindrical lens made of P-SF68 10 (Schott, n=1.96) with r=0.51 mm and a thickness of 0.46 mm. (on the beam axis) was placed at a distance Δ=150 µm from the facet of the tapered laser diode. The conditions on n (Eq. 6) and r (Eq. 7) were thus met. Ellipticity of the laser beam on the curved surface of the lens amounted to 0.51, which corresponds to the desired ratio of $d_f/d_s=M_f^2/M_s^2=0.5$. The fast axis divergence after the lens was reduced to 10.1°, which is approximately equal to half the slow axis divergence.

Figure 6:
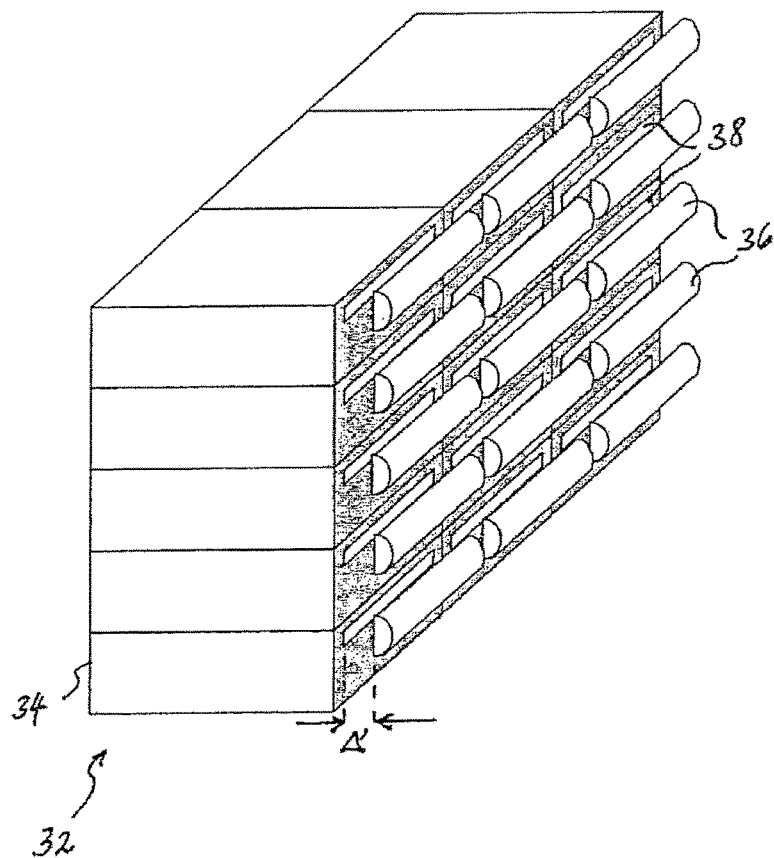
FIG. 6: is a perspective schematic view of a semiconductor laser diode array.

FIG. 6 relates to a second preferred embodiment of the invention and shows a semiconductor laser diode array 32 comprising a stack of tapered laser diodes 34, each comprising a plano-convex spherical cylindrical microlens 36 arranged in front of its facet 38.

Each tapered laser diode 34 produces a highly astigmatic and elliptical beam at its output. It is assumed that $M_f^2 \approx 1$, whereas $M_s^2$ is larger (e.g. $M_s^2$ comprised in the range from 2 to 5), as if often the case in industrial systems because this makes laser diodes more robust against back-reflections. Each lens 36 is positioned such that its circular cylindrical surface intersects the respective beam axis at an axial position where the ratio $d_s/d_f$ of the slow axis beam diameter $d_s$ of the laser beam (after passage through the lens 36) to the fast axis beam diameter $d_f$ of the laser beam (after passage through the lens 36) amounts to a value comprised in the range from $0.87 \cdot M_s^2/M_f^2$ to $1.15 M_s^2/M_f^2$. Furthermore, the parameters of each lens are chosen such that the fast axis divergence of the respective laser beam is reduced to approximately match $M_f^2/M_s^2$ times the slow axis divergence. As a consequence, by focusing the beam, one obtains a circular power density distribution.

As in the previously discussed embodiment, the material of each lens 36 is chosen such that its refraction index satisfies Eq. 6. The distance Δ' between the planar surface of each lens 36 and the respective facet 38 is comprised in the range from 50 µm to 500 µm. The radius of curvature of each lens is chosen such that, after passage of the laser beam there through, the fast axis divergence is substantially in agreement with the slow axis divergence multiplied with $M_f^2/M_s^2$, i.e. Eq. 7 is satisfied.

Example 3

The tapered laser diode of example 2 can be used to build a laser diode stack, which consists of 20 laser diode bars, each of which consists of 10 tapered laser diodes with a pitch (center to center of the tapered laser diode) of 1 mm. The spacing between the laser diode bars may be 0.5 mm, such that the laser diode stack has a square emitting area of 10 mm by 10 mm. Since each emitter is capable of producing at least 5 W of optical power, the stack can deliver more than 1000 W of optical power. The optics detailed in example 2 may be mounted in front of each laser diode bar and afterwards a multi lens array can collimate each tapered laser diode individually, each facet of the multi lens array comprising a lens with the geometrical ratio equal to $d_f/d_s$. After the multi lens array, a collimated beam consisting of 200 smaller beams is obtained, which can be focused by a lens into a fiber of 100 µm diameter with a numerical aperture of 0.22.

Figure 7:
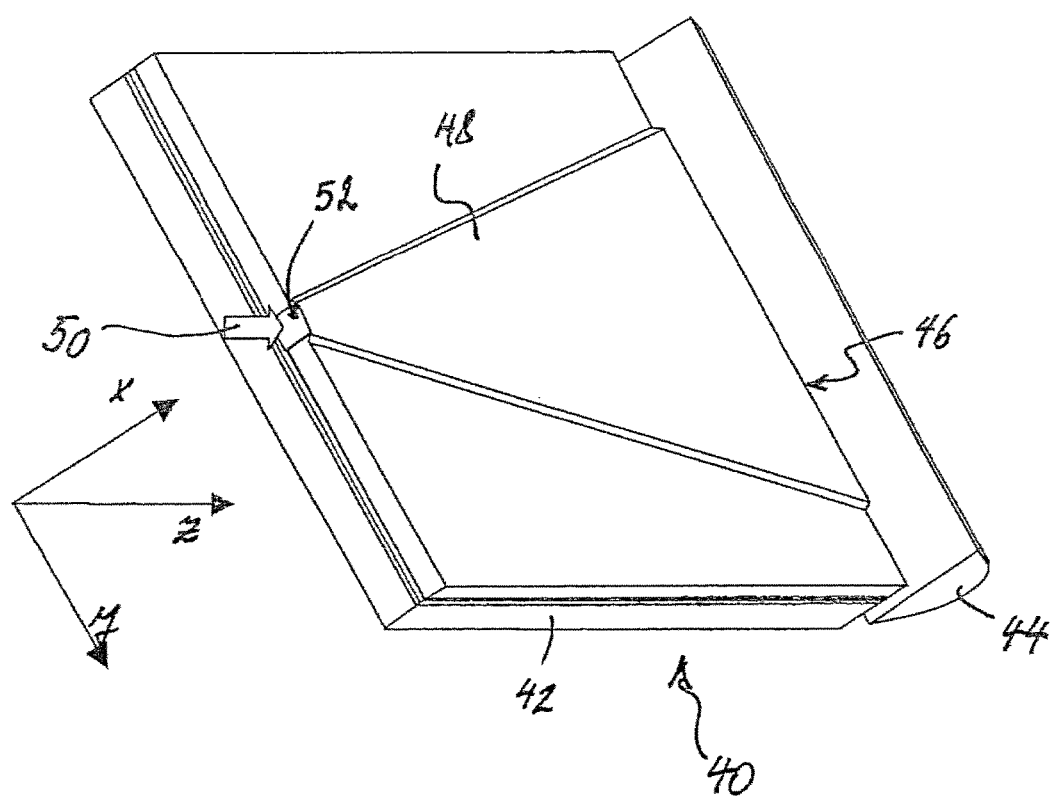
FIG. 7: is a perspective schematic view of a semiconductor laser module according to a further preferred embodiment of the invention.

FIG. 7 shows a semiconductor laser module 40 according to a further preferred embodiment of the invention. Semiconductor laser module 40 comprises tapered amplifier diode 42 and beam shaping optics in the form of a plano-convex spherical cylindrical lens 44 arranged directly in front of the output facet 46 of the tapered laser diode 42. The tapered gain region 48 amplifies a seed beam 50 input at input facet 52 of the tapered amplifier diode 42. The plano-convex spherical cylindrical lens 44 is configured and positioned so as to match the fast axis divergence $\theta_f$ with $\theta_s \cdot M_f^2/M_s^2$ at the position where $d_f/d_s=M_f^2/M_s^2$, in accordance with what has been explained with respect to FIGS. 1 to 3.

While specific embodiments have been described in detail, those with skill in the art will appreciate that various modifications and alternatives to those details could be developed in light of the overall teachings of the disclosure. Accordingly, the particular arrangements disclosed are meant to be illustrative only and not limiting as to the scope of the invention, which is to be given the full breadth of the appended claims and any and all equivalents thereof.

The invention claimed is:

1. A semiconductor laser module, comprising at least one of a tapered laser diode and a tapered amplifier diode, including an emission facet for emitting a laser beam along a beam axis, said laser beam having a beam quality factor in fast axis direction, hereinafter denoted $M_f^2$, and a beam quality factor in slow axis direction, hereinafter denoted $M_s^2$; and beam shaping optics;

wherein said beam-shaping optics comprise a plano-convex cylindrical lens oriented so as to change divergence of said beam in fast axis direction, said plano-convex cylindrical lens having a planar surface arranged facing said facet a circular cylindrical surface facing away from said facet and a refractive index, hereinafter denoted n, chosen such that the condition $$93\% \cdot \sqrt{\sin u_f / \sin\left(u_s \cdot \frac{M_f^2}{M_s^2}\right)} \leq n \leq 107\% \cdot \sqrt{\sin u_f / \sin\left(u_s \cdot \frac{M_f^2}{M_s^2}\right)},$$

where $u_f$ denotes the uncorrected $1/e^2$ fast axis divergence half-angle of said laser beam and $u_s$ denotes the uncorrected $1/e^2$ slow axis divergence half-angle of said laser beam, is satisfied.

2. The semiconductor laser module as claimed in claim 1, wherein said plano-convex cylindrical lens is configured and positioned such that said circular cylindrical surface intersects said beam axis at an axial position where the ratio of the slow axis beam diameter of said laser beam to the fast axis beam diameter of said laser beam amounts to a value in the range from $0.87 \cdot M_s^2/M_f^2$ to $1.15 \cdot M_s^2/M_f^2$.

3. The semiconductor laser module as claimed in claim 1 wherein said planar surface of said plano-convex cylindrical lens is arranged at a distance from said facet comprised in the range from 50 μm to 1 mm.

4. The semiconductor laser module as claimed in claim 1, wherein a radius of curvature of said circular cylindrical surface of said plano-convex cylindrical lens is chosen such that said divergence of said beam in fast axis direction is reduced to match a product of a divergence of said beam in slow axis direction and the ratio $M_f^2/M_s^2$.

5. The semiconductor laser module as claimed in claim 1, wherein said laser beam emitted at said facet has an uncorrected fast axis divergence half-angle comprised in the range from 12-23° and an uncorrected slow axis divergence half-angle comprised in the range from 6-13°.

6. The semiconductor laser module as claimed in claim 1, wherein said circular cylindrical surface of said plano-convex cylindrical lens has a radius of curvature satisfying the condition:

$$87\% \cdot \frac{d_f}{2(n+1)\tan\left(u_s \cdot \frac{M_f^2}{M_s^2}\right)} \leq r \leq 115\% \cdot \frac{d_f}{2(n+1)\tan\left(u_s \cdot \frac{M_f^2}{M_s^2}\right)},$$

where r denotes said radius of curvature, $d_f$ denotes the beam diameter in fast axis direction of said laser beam at the axial position in which said circular cylindrical surface intersects said beam axis, n denotes said refractive index and $u_s$ denotes the uncorrected slow axis divergence half-angle of said laser beam.

7. The semiconductor laser module as claimed in claim 1, wherein said facet has a width in slow axis direction comprised in the range from 150 μm to 2 mm and a height in fast axis direction comprised in the range from 0.1 μm to 5 μm.

8. The semiconductor laser module as claimed in claim 1, wherein said plano-convex cylindrical lens has a focal length comprised in the range from 1 mm to 10 mm.

9. A semiconductor laser array comprising a stack of a plurality of semiconductor laser modules as claimed in claim 1.

10. The semiconductor laser array as claimed in claim 9, wherein said semiconductor laser modules are substantially identical.

11. A semiconductor laser module, comprising at least one of a tapered laser diode and a tapered amplifier diode, including an emission facet for emitting a laser beam along a beam axis, said laser beam having a beam quality factor in fast axis direction, hereinafter denoted $M_f^2$, and a beam quality factor in slow axis direction, hereinafter denoted $M_s^2$; and beam shaping optics;

wherein said beam-shaping optics comprise a plano-convex cylindrical lens positioned directly in front of the emission facet and oriented so as to reduce divergence of said beam in fast axis direction, said plano-convex cylindrical lens having a planar surface arranged facing said facet, and a circular cylindrical surface facing away from said facet, and wherein circular cylindrical surface has a radius of curvature chosen such that said divergence of said beam in fast axis direction is reduced to match the product of divergence of said beam in slow axis direction and the ratio $M_f^2/M_s^2$ wherein the plano-convex cylindrical lens has a refractive index n chosen such that the condition $$93\% \cdot \sqrt{\sin u_f / \sin\left(u_s \cdot \frac{M_f^2}{M_s^2}\right)} \leq n \leq 107\% \cdot \sqrt{\sin u_f / \sin\left(u_s \cdot \frac{M_f^2}{M_s^2}\right)},$$

where ur denotes the uncorrected 1/e2 fast axis divergence half-angle of said laser beam us denotes the uncorrected 1/e2 slow axis divergence half-angle of said laser beam, is satisfied.

12. The semiconductor laser module as claimed in claim 11, wherein said plano-convex cylindrical lens is configured and positioned such that said circular cylindrical surface intersects said beam axis at an axial position where the ratio of the slow axis beam diameter of said laser beam to the fast axis beam diameter of said laser beam amounts to a value in the range from $0.87 \cdot M_s^2/M_f^2$ to $1.15 \cdot M_s^2/M_f^2$.

13. The semiconductor laser module as claimed in claim 11, wherein said circular cylindrical surface of said plano-convex cylindrical lens has a radius of curvature r satisfying the condition:

$$87\% \cdot \frac{d_f}{2(n+1)\tan\left(u_s \frac{M_f^2}{M_s^2}\right)} \leq r \leq 115\% \cdot \frac{d_f}{2(n+1)\tan\left(u_s \frac{M_f^2}{M_s^2}\right)},$$

where $d_f$ denotes the beam diameter in fast axis direction of said laser beam at the axial position in which said circular cylindrical surface intersects said beam axis, n denotes said refractive index and $u_s$ denotes the uncorrected slow axis divergence half-angle of said laser beam.

14. A semiconductor laser module, comprising at least one of a tapered laser diode and a tapered amplifier diode, including an emission facet for emitting a laser beam along a beam axis, said laser beam having a beam quality factor in fast axis direction, hereinafter denoted $M_f^2$, and a beam quality factor in slow axis direction, hereinafter denoted $M_s^2$, said laser beam having a first virtual source from which said laser beam appears to diverge in fast axis direction and a second virtual source from which said laser beam appears to diverge in slow axis direction, said second virtual source being located farther away from the emission facet than said first virtual source; and beam shaping optics;

wherein said beam-shaping optics comprise a plano-convex cylindrical lens positioned directly in front of the emission facet and oriented so as to change divergence of said beam in fast axis direction, said plano-convex cylindrical lens having a planar surface arranged facing said facet, a circular cylindrical surface facing away from said facet; and wherein the plano-convex cylindrical lens is configured and arranged to satisfy the aplanatic condition in such a way that a virtual image of the first virtual source by the plano-convex cylindrical lens substantially coincides with the second virtual source wherein the plano-convex cylindrical lens has a refractive index n chosen such that the condition $$93\% \cdot \sqrt{\sin u_f / \sin\left(u_s \cdot \frac{M_f^2}{M_s^2}\right)} \leq n \leq 107\% \cdot \sqrt{\sin u_f / \sin\left(u_s \cdot \frac{M_f^2}{M_s^2}\right)},$$

where $u_f$ denotes the uncorrected 1/e2 fast axis divergence half-angle of said laser beam $u_s$ denotes the uncorrected 1/e2 slow axis divergence half-angle of said laser beam, is satisfied.

15. The semiconductor laser module as claimed in claim 14, wherein said plano-convex cylindrical lens is configured and positioned such that said circular cylindrical surface intersects said beam axis at an axial position where the ratio of the slow axis beam diameter of said laser beam to the fast axis beam diameter of said laser beam amounts to a value in the range from $0.87 \cdot M_s^2/M_f^2$ to $1.15 \cdot M_s^2/M_f^2$.

16. The semiconductor laser module as claimed in claim 14, wherein said circular cylindrical surface of said plano-convex cylindrical lens has a radius of curvature r satisfying the condition:

$$87\% \cdot \frac{d_f}{2(n+1)\tan\left(u_s \frac{M_f^2}{M_s^2}\right)} \leq r \leq 115\% \cdot \frac{d_f}{2(n+1)\tan\left(u_s \frac{M_f^2}{M_s^2}\right)},$$

where $d_f$ denotes the beam diameter in fast axis direction of said laser beam at the axial position in which said circular cylindrical surface intersects said beam axis, n denotes said refractive index and $u_s$ denotes the uncorrected slow axis divergence half-angle of said laser beam.

* * * * *